(12) United States Patent
Weber et al.

(10) Patent No.: US 12,163,851 B2
(45) Date of Patent: Dec. 10, 2024

(54) MICROMECHANICAL COMPONENT FOR A SENSOR DEVICE HAVING A CAPACITOR SEALING STRUCTURE

(71) Applicant: Robert Bosch GmbH, Stuttgart (DE)

(72) Inventors: Heribert Weber, Nuertingen (DE); Peter Schmollngruber, Aidlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 330 days.

(21) Appl. No.: 17/831,719

(22) Filed: Jun. 3, 2022

(65) Prior Publication Data
US 2022/0390311 A1 Dec. 8, 2022

(30) Foreign Application Priority Data
Jun. 8, 2021 (DE) ............. 10 2021 205 736.5

(51) Int. Cl.
*G01L 19/06* (2006.01)
*B81B 7/00* (2006.01)
*B81C 1/00* (2006.01)
*G01L 13/06* (2006.01)

(52) U.S. Cl.
CPC ........ *G01L 19/0645* (2013.01); *B81B 7/0041* (2013.01); *B81C 1/00293* (2013.01); *G01L 13/06* (2013.01); *B81B 2201/0264* (2013.01); *B81B 2203/0127* (2013.01); *B81B 2203/04* (2013.01)

(58) Field of Classification Search
None
See application file for complete search history.

(56) References Cited

U.S. PATENT DOCUMENTS

| | | | |
|---|---|---|---|
| 6,308,569 B1 | 10/2001 | Stewart | |
| 7,273,764 B2 * | 9/2007 | Reichenbach | B81C 1/00293 257/E21.613 |
| 9,726,563 B2 * | 8/2017 | Fujita | B81C 1/00293 |
| 9,772,245 B2 * | 9/2017 | Besling | G01L 9/0045 |

(Continued)

FOREIGN PATENT DOCUMENTS

| | | |
|---|---|---|
| DE | 10303263 A1 | 8/2004 |
| DE | 102004043356 A1 | 3/2006 |

(Continued)

*Primary Examiner* — Peter J Macchiarolo
*Assistant Examiner* — Jermaine L Jenkins
(74) *Attorney, Agent, or Firm* — NORTON ROSE FULBRIGHT US LLP; Gerard A. Messina

(57) ABSTRACT

A micromechanical component for a sensor device, including a substrate, at least one first counter-electrode, at least one first electrode adjustably situated on a side of the at least one first counter-electrode facing away from the substrate, and a capacitor sealing structure, which seals gas-tight an interior volume, including the at least one first counter-electrode present therein and the at least one first electrode present therein. The at least one first counter-electrode is fastened directly or indirectly to a frame structure fastened directly or indirectly to the substrate, and the frame structure framing a cavity, and the at least one first counter-electrode at least partially spanning the cavity in such a way that at least one gas is transferable between the cavity and the interior volume via at least one opening formed at and/or in the at least one first counter-electrode.

20 Claims, 15 Drawing Sheets

(56) References Cited

U.S. PATENT DOCUMENTS 9,958,348 B2 * 5/2018 Classen ................. G01L 9/0041
2022/0298005 A1 * 9/2022 Loeppert ............... B81B 3/0054

FOREIGN PATENT DOCUMENTS

| DE | 102014200512 A1 | 7/2015 | | |
| DE | 102016216234 A1 | 3/2018 | | |
| EP | 2029474 B1 | 7/2017 | | |
| WO | WO-2018041498 A1 * | 3/2018 | ........... | B81B 3/0051 |

* cited by examiner

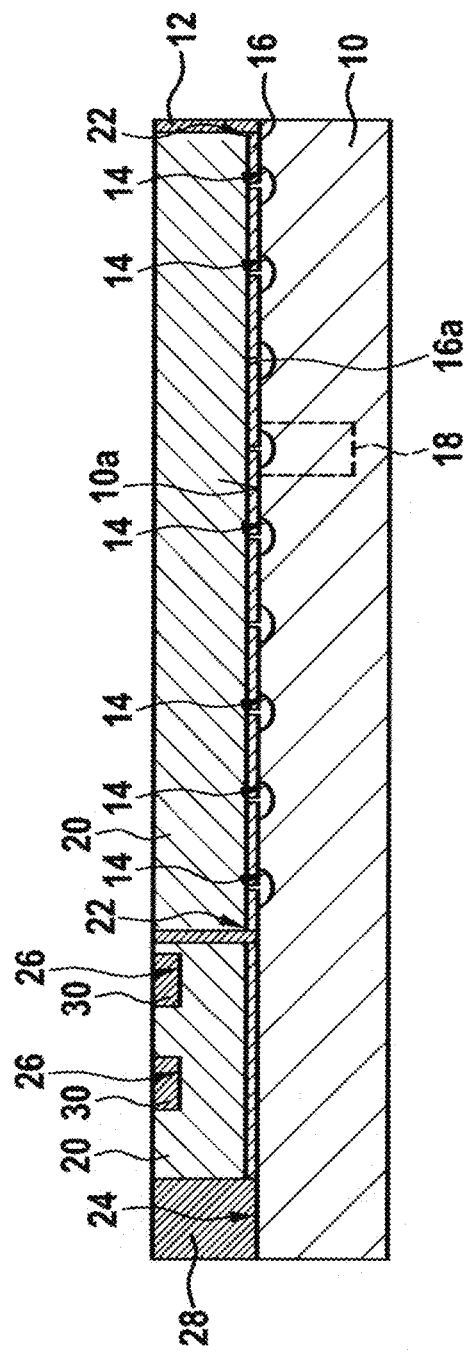

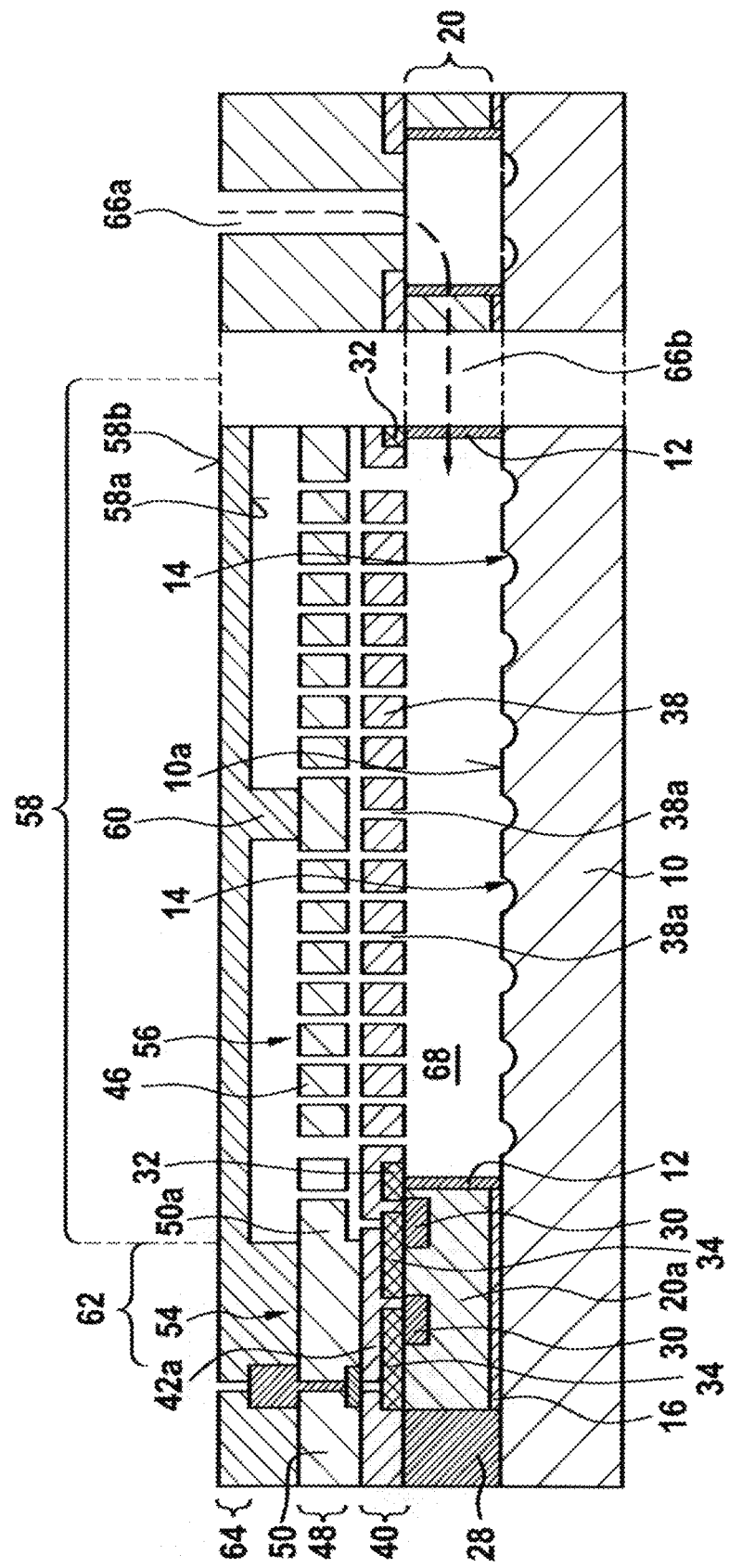

MICROMECHANICAL COMPONENT FOR A SENSOR DEVICE HAVING A CAPACITOR SEALING STRUCTURE

CROSS REFERENCE

The present application claims the benefit under 35 U.S.C. § 119 of German Patent Application No. DE 10 2021 205 736.5 filed on Jun. 8, 2021, which is expressly incorporated herein by reference in its entirety.

FIELD

The present invention relates to a micromechanical component for a sensor device. The present invention likewise relates to a manufacturing method for a micromechanical component for a sensor device.

BACKGROUND INFORMATION

Sensor elements which include trenched cavities are described, for example, in German Patent Application No. DE 10 2004 043 356 A1.

SUMMARY

The present invention provides a micromechanical component for a sensor device and a manufacturing method for a micromechanical component for a sensor device.

The present invention provides micromechanical components, which include a cavity in addition to their particular interior volume within which the electrodes of the particular micromechanical component are situated, so that at least one gas may be transmitted from their interior volume into their cavity. Outgassing/diffusing substances, for example hydrogen, nitrogen, oxygen (e.g., outgassed from tetraethyl orthosilicate (TEOS)), dopants and thus forming carbon-containing gases, such as, in particular, methane or ethane, may be distributed from the interior volume into the cavity in a micromechanical component according to the present invention in such a way that a specific quantity of the outgassing/diffusing substances results in a smaller change in the particular reference pressure in the interior volume. The micromechanical components provided with the aid of the present invention are thus suitable for carrying out reliable, precise measurements for longer than the related art, for example, pressure measurements adhering to predefined specification limits.

In conventional pressure sensors, outgassing and/or diffusion effects frequently result in an increase of a reference pressure in the particular pressure sensor and thus in an undesirable drift of sensor signals of the particular pressure sensor. The smaller the interior volume within which the electrodes of the particular micromechanical component are present, the higher is the percentage increase of the reference pressure "enclosed" in the interior volume. In the course of the ongoing miniaturization of MEMS components, this aspect takes on an increasingly greater weight (an increasingly greater influence).

In one advantageous specific example embodiment of the micromechanical component of the present invention, at least one indentation is structured in a substrate surface of the substrate abutting the cavity within the frame structure. In this way, the volume of the cavity, which may be used for the gas transfer with the interior volume, may be additionally increased. The effects of outgassings/diffusions on the reference pressure present in the interior volume may thus be additionally minimized with the aid of the at least one indentation.

In a further advantageous specific example embodiment of the micromechanical component of the present invention, the at least one first counter-electrode fastened directly or indirectly at least to the frame structure is electrically insulated from the frame structure and/or the substrate with the aid of at least one insulating area formed from at least one electrically insulating material, which is situated or formed within the frame structure and/or between the frame structure and the at least one first counter-electrode. A potential present at the at least one counter-electrode in each case may thus deviate from a potential of the frame structure and/or the substrate.

For example, the capacitor sealing structure may include a stretched diaphragm on a side of the at least one first electrode facing away from the substrate, whose diaphragm inner side limits the interior volume, and which may bulge at a pressure difference not equal to zero between a pressure present at the diaphragm outer side facing away from the interior volume and a reference pressure present in the interior volume, by which the at least one first electrode suspended at the diaphragm inner side and electrically connected to the diaphragm is adjustable. The specific embodiment of the micromechanical component described here may thus be particularly effectively used as (at least one part of) a pressure sensor.

As an advantageous refinement of the present invention, the at least one first electrode may be suspended at the diaphragm inner side via at least one suspension structure fastened to the diaphragm inner side and be electrically connected to the diaphragm, the micromechanical component additionally including at least one second electrode present in the interior volume, which is also suspended at the diaphragm inner side via the at least one suspension structure and is electrically connected to the diaphragm in such a way that the at least one second electrode, like the at least one first electrode, is adjustable with the aid of a bulging of the diaphragm, and the micromechanical component additionally including a second counter-electrode present in the interior volume, which is situated on a side of the at least one second electrode facing away from the substrate. While the at least one first electrode and the at least one first counter-electrode in this specific embodiment of the micromechanical component are used as at least one first capacitor, the at least one second electrode and the at least one second counter-electrode may additionally be used as at least one second capacitor. With the aid of a difference formation between a first capacitance of the at least one first capacitor and a second capacitance of the at least one second capacitor, more precise and more exact measured values may be determined with the aid of a suitable measuring circuit, for example a Wheatstone bridge circuit, by which an increase of the measuring sensitivity may be achieved.

In this case, the at least one first counter-electrode and the at least one second electrode are preferably formed from a first electrode layer, and the at least one first electrode and the at least one second counter-electrode are formed from a second electrode layer, the diaphragm being electrically insulated from the components formed from the second electrode layer with the aid of at least one diaphragm insulating area made from the at least one and/or at least one further electrically insulating material. A potential present at the diaphragm thus does not impair the at least one potential of the components formed from the second electrode layer.

In a further advantageous refinement of the micromechanical component of the present invention, the at least one first electrode is suspended at the diaphragm inner side via at least one suspension structure fastened to the diaphragm inner side and is electrically connected to the diaphragm, the micromechanical component additionally including at least one second counter-electrode present in the interior volume, which is fastened directly or indirectly to the capacitor sealing structure and/or the substrate on the side of the at least one first electrode facing away from the substrate, and which includes at least one continuous recess, through which the at least one suspension structure of the first electrode is guided. In the specific embodiment described here, the at least one first counter-electrode and the at least one first electrode may also be used as at least one first capacitor, and the at least one second counter-electrode and the at least one first electrode may be used as at least one second capacitor. The advantages of a difference formation from a first capacitance of the at least one first capacitor and a second capacitance of the at least one second capacitor may thus also be used for the specific embodiment of the micromechanical component described here.

In this case, the at least one first counter-electrode is preferably formed from a first electrode layer, the at least one first electrode is formed from a second electrode layer, and the at least one second counter-electrode is formed from a third electrode layer, the diaphragm being electrically insulated from the at least one component formed from the third electrode layer with the aid of at least one diaphragm insulating area made from the at least one and/or at least one further electrically insulating material. The potential present at the diaphragm thus does not influence the at least one potential of the at least one component structured out of the third electrode layer.

The at least one electrically insulating material of the at least one insulating area and/or the at least one diaphragm insulating area preferably has an electrical conductivity in each case of less than or equal to $10^{-8}$ S·cm$^{-1}$ and/or a specific resistance of greater than or equal to $10^{8}$ Ω·cm. The at least one electrically insulating material of the at least one insulating area and/or of the at least one diaphragm insulating area also advantageously has a high etching resistance to the etching medium for removing sacrificial material/sacrificial layers. The at least one insulating area and/or the at least one diaphragm insulating area is/are thus advantageously suitable for ensuring a desired insulation in each case.

The advantages described above are also established by carrying out a corresponding manufacturing method for a micromechanical component for a sensor device. It is expressly pointed out that the manufacturing method may be refined according to the specific embodiments of the micromechanical component explained above.

BRIEF DESCRIPTION OF THE DRAWINGS

Further features and advantages of the present invention are explained below based on the figures.

FIGS. 1A through 1F show schematic cross sections of intermediate products for explaining a first specific example embodiment of the manufacturing method for a micromechanical component for a sensor device, in accordance with the present invention.

DETAILED DESCRIPTION OF EXAMPLE EMBODIMENTS

Figure 1B:
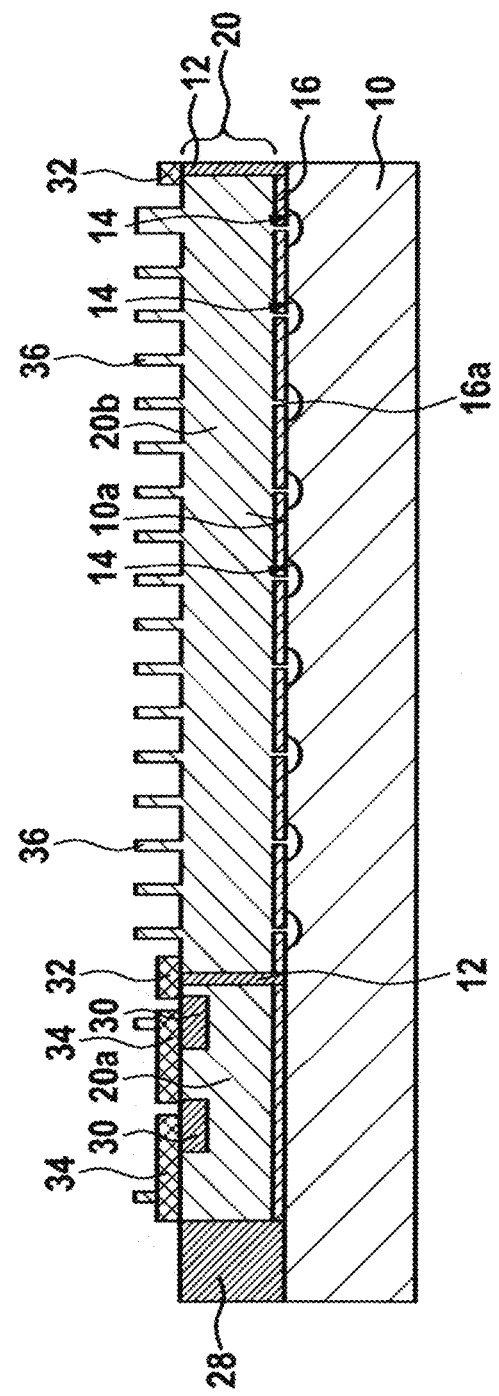
Figure 1C:
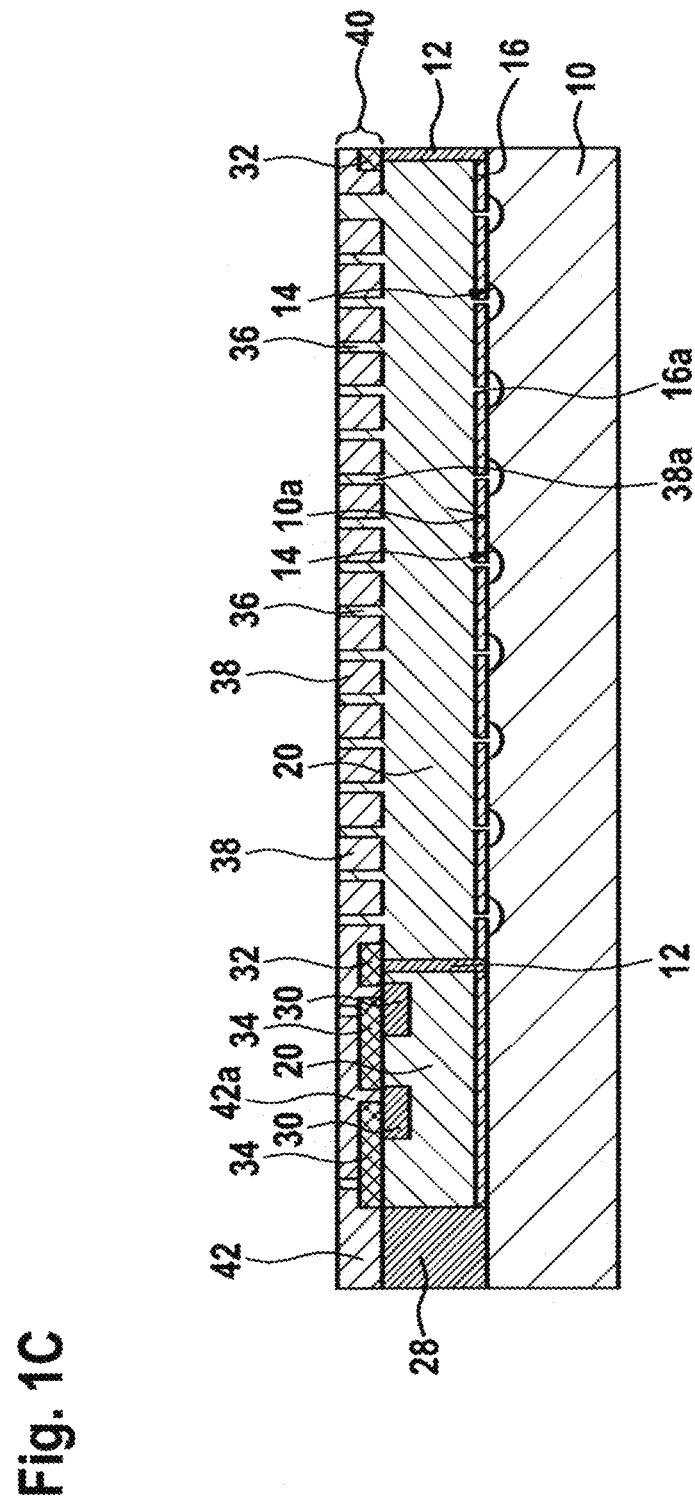

FIGS. 1A through 1F show schematic cross sections of intermediate products for explaining a first specific embodiment of the manufacturing method for a micromechanical component for a sensor device.

In the manufacturing method described here, at least one (later) first counter-electrode of the micromechanical component is indirectly fastened to a substrate 10, in that the at least one first counter-electrode is fastened directly or indirectly to a frame structure 12. In a later manufacturing process, this frame structure 12 may be used, at least in areas, as a lateral etch stop and/or as a substrate contacting structure. Substrate 10, to which frame structure 12 may be directly or indirectly connected, may be a semiconductor substrate, in particular, a silicon substrate. Alternatively or additionally to silicon, however, substrate 10 may also include at least one other semiconductor material, at least one metal and/or at least one insulator.

Below is a description of how frame structure 12 is formed between substrate 10 and the at least one (later) first counter-electrode:

As an optional refinement of the manufacturing method described here, prior to forming frame structure 12, at least one indentation 14 may be structured in a substrate surface 10a of substrate 10, which abuts a later cavity framed by frame structure 12. For this purpose, an etching mask layer 16 may be formed on substrate surface 10a in such a way that etching mask layer 16 includes at least one continuous opening 16a in the area of the at least one later indentation 14. Etching mask layer 16 may be, for example, a silicon dioxide layer 16. The at least one indentation 14 may subsequently be etched into substrate surface 10a of substrate 10, for example, with the aid of a plasma and/or trench etching process. The particular etching process may be optionally isotropic and/or anisotropic. As illustrated with the aid of dashed line 18 in FIG. 1A, a shape and/or a depth of the at least one indentation 14 may be designed with a great design freedom. For example, when etching the at least one indentation 14, the etch fronts may also converge in such a way that formed indentations 14 transition into each other. As is apparent based on the following description, a rapid (lateral) distribution of an etching medium over a wide area, e.g., HF vapor, is achieved with the aid of the at least one indentation 14 structured into substrate surface 10a, by which an additional volume enlargement of the later cavity framed by frame structure 12 is effectuated.

As illustrated in FIG. 1A, a first sacrificial layer 20 is deposited onto etching mask layer 16 after the structuring of the at least one indentation 14 into substrate surface 10a of substrate 10. With the aid of a relatively small maximum width of the at least one continuous opening 16a of etching mask layer 16 in parallel to substrate surface 10a, it is possible to ensure that the at least one continuous opening 16a is closed with the aid of first sacrificial layer 20 without the at least one indentation 14 being filled with the at least one material of first sacrificial layer 20. First sacrificial layer 20 is preferably made from the at least one identical material as etching mask layer 16. Sacrificial layer 20 may be, for example, a silicon dioxide layer 20.

At least one continuous trench 22 up to substrate 10 is structured/etched through first sacrificial layer 20 and etching mask layer 16 to form frame structure 12. The at least one continuous trench 22 is formed in such a way that it frames the later cavity. Simultaneously with the at least one continuous trench 22, at least one further continuous trench 24 up to substrate 10 may be structured through first sacrificial layer 20 and etching mask layer 16. In addition, prior to or after the structuring/etching of the at least one continuous trench 22 and the at least one further trench 24, at least one indentation 26 may also be structured/etched into first sacrificial material layer 20, which offers a negative form for later printed conductor structures.

FIG. 1A shows an intermediate product after the deposition of at least one semiconductor material and/or at least one metal, for example polysilicon, for filling at least the at least one continuous trench 22 and 24. In this way, at least one substrate contacting structure 28 may be formed (in the at least one continuous trench 24) in addition to frame structure 12 (in the at least one continuous trench 22). Moreover, at least one printed conductor 30 may also be formed by filling in the at least one indentation 26. Preferably, after depositing the at least one semiconductor material and/or the at least one metal, an upper side of first sacrificial layer 20 facing away from substrate 10 is exposed again, at least in areas, and a planar surface is generated with the aid of a chemical-mechanical polishing step.

In the specific embodiment of the manufacturing method described here, the at least one first counter-electrode fastened later on directly or indirectly to frame structure 12 is electrically insulated from frame structure 12 and/or substrate 10 with the aid of at least one insulating area 32 made from at least one electrically insulating material. The at least one electrically insulating material of the at least one insulating area 32 preferably has an electrical conductivity in each case of less than or equal to $10^{-8}$ S·cm$^{-1}$ and/or a specific resistance of greater than or equal to $10^8$ Ω·cm. In addition, the at least one electrically insulating material of the at least one insulating area 32 preferably has an etching rate with respect to an etching medium used later on, which is lower at least by a factor of 2 than an etching rate of the particular etching medium for the at least one material of first sacrificial layer 20. The at least one electrically insulating material of the at least one insulating area 32 may be, for example, silicon-rich silicon nitride. If at least a subarea 20a of first sacrificial layer 20 is to be protected against the etching medium used in each case during an etching of at least one other subarea 20b of first sacrificial layer 20 to be carried out later on, the at least one subarea 20a of sacrificial layer 20 to be protected may also be covered with at least one etch stop layer 34 made from the at least one same electrically insulating material as the at least one insulating area 32. A single deposition and structuring operation may thus be carried out for forming the at least one insulating area 32 and the at least one etch stop layer 34. It is further also possible to generate continuous trench 22 of frame structure 12 only prior to forming etch stop layer 34 and to fill it with etch stop layer 34.

The at least one insulating area 32 may optionally cover frame structure 12 and/or be situated or formed between frame structure 12 and the at least one later first counter-electrode. In the exemplary embodiment described here, the at least one insulating area 32 is formed on a side of frame structure 12 facing away from substrate 10 only as an example.

FIG. 1B shows an intermediate product after a deposition of a second sacrificial layer 36. Second sacrificial layer 36 is preferably made from the at least one same material as first sacrificial layer 20. Second sacrificial layer 36 may be, for example, a (further) silicon dioxide layer 36. With the aid of a subsequent structuring of second sacrificial layer 36, a negative form of at least the at least one first counter-electrode is established, and etch stop layer 34, insulating area 32 and at least one contacting area for at least one printed conductor 30 are exposed, at least in areas.

Afterwards, the at least one first counter-electrode 38 is formed from at least subareas of a first electrode layer 40. The at least one first counter-electrode 38 is formed with at least one opening 38a running through or along the at least one first counter-electrode 38 and filled at this point in time with material of second sacrificial layer 36. The function of the at least one opening 38a at and/or in the at least one first counter-electrode 38 is discussed below.

In the specific embodiment described here, for this purpose, first electrode layer 40 is deposited into the indentations previously formed in second sacrificial layer 36. First electrode layer 40 may subsequently be removed on the surface until second sacrificial layer 36 is exposed again, at least in areas. The removal of first electrode layer 40 on the surface may be carried out, for example, with the aid of a chemical-mechanical polishing step. In this way, a planar surface may be achieved. First electrode layer 40 may be used during a later operation, for example, as at least one counter-electrode. At least one subarea 42 or 42a of first electrode layer 40 may be used as a part, a subarea or a component of the later capacitor sealing structure. The at least one counter-electrode and/or the at least one subarea 42 and 42a may be optionally at least partially surrounded on three sides by sacrificial layer 36.

Alternatively, however, instead of the deposition and structuring of second sacrificial layer 36, first electrode layer 40 may be deposited onto first sacrificial layer 20, and at least the at least one first counter-electrode 38 may be structured out of first electrode layer 40. In this case, only after the structuring at least of the at least one first counter-electrode 38 out of first electrode layer 40, second sacrificial layer 36 is deposited into the resulting indentations, and the surface of second sacrificial layer 36 is optionally planarized, e.g., with the aid of a chemical-mechanical polishing step. In this procedure, the deposition of a third sacrificial layer 44 described below may be omitted.

First electrode layer 40 is understood to be a semiconductor and/or metal layer. First electrode layer 40 may be, for example, a polysilicon layer 40. As is also apparent in FIG. 1C, at least one further subarea 42 and a subarea 42a of the later capacitor sealing structure may be formed from first electrode layer 40. Subareas 42, 42a may be electrically contacted with the aid of printed conductors 30 and contact hole openings in etch stop layer 34, and they may be used to anchor/clamp later diaphragm 58 and/or to electrically contact second electrode layer 58 and/or diaphragm layer 64 and/or substrate 10.

Figure 1D:
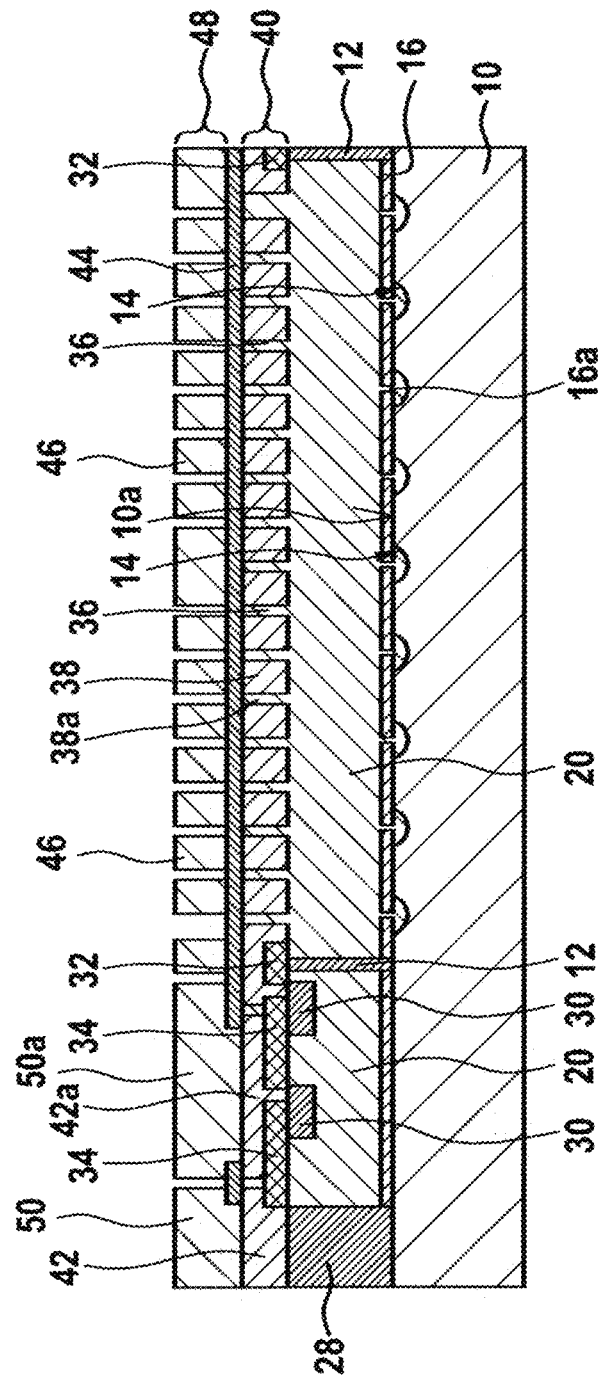

As is illustrated in FIG. 1D, a third sacrificial layer 44 may be deposited onto at least the at least one first counter-electrode 38 after carrying out the chemical-mechanical polishing step for exposing second sacrificial layer 36 at least in areas. The at least one material of third sacrificial layer 44 is preferably identical to the at least one material of sacrificial layers 20 and 36. For example, third sacrificial layer 44 may also be a silicon dioxide layer 44. An electrical connection at least between components of the later capacitor sealing structure or a later anchoring/clamping structure of a diaphragm may optionally be formed with the aid of a continuous contact hole structure through third sacrificial layer 44. In the manufacturing method described here, at least one first (later adjustable) electrode 46 is situated on a side of the at least one first counter-electrode 38 facing away from substrate 10. The at least one first electrode 46 is formed from at least subareas of a second electrode layer 48. Second electrode layer 48 is also understood to be a semiconductor and/or metal layer. Second electrode layer 48 is preferably a polysilicon layer 48. For example, as illustrated in FIG. 1D, second electrode layer 48 may be deposited onto third sacrificial layer 44, and afterward at least the at least one first electrode 46 may be structured out of second electrode layer 48. Alternatively, a further sacrificial layer may also be deposited and structured on third sacrificial layer 44 in such a way that a negative form at least of the at least one first electrode 46 is formed in the further sacrificial layer. After structuring the further sacrificial layer, second electrode layer 48 may then be deposited into the resulting indentation and, after carrying out a chemical-mechanical polishing step, the further sacrificial layer may be exposed again on third sacrificial layer 44, at least in areas.

As is also apparent in FIG. 1D, at least one further subarea of a later electrical contacting structure 50 and/or a subarea of the later capacitor sealing structure, at least one subarea of the clamping/anchoring structure and/or at least one electrical printed conductor 50a may be formed from second electrode layer 48. If necessary, an electrical connection of the at least one subarea of a later electrical contacting structure 50, of the at least one subarea of the later capacitor sealing structure and/or of the at least one subarea of the clamping/anchoring structure and/or of the at least one electrical printed conductor 50a to at least one subarea 42 and 42a formed from first electrode layer 40 may be implemented with the aid of the at least one continuous contact hole opening through third sacrificial layer 44.

A fourth sacrificial layer 52 is deposited onto and optionally planarized on at least the at least one first electrode 46. The at least one material of fourth sacrificial layer 52 is preferably identical to the at least one material of further sacrificial layers 20, 36 and 44. Fourth sacrificial layer 52 may be, for example, a silicon dioxide layer 52.

In the manufacturing method described here, in addition to the at least one first counter-electrode 38 and the at least one first electrode 46, finished capacitor sealing structure 54 is also formed, which is fastened directly or indirectly to substrate 10, and which seals gas-tight an interior volume 56, including the at least one first counter-electrode 38 present therein and the at least one first electrode 46 present therein. For example, capacitor sealing structure 54 is also formed with a stretched diaphragm 58, which is situated on a side of the at least one first electrode 46 facing away from substrate 10, and at whose diaphragm inner side 58a the at least one first electrode 46 is suspended.

To form at least one suspension structure 60, with the aid of which the at least one first electrode 46 is suspended at diaphragm inner side 58a of diaphragm 58 and is electrically connected to diaphragm 58, at least one continuous recess through fourth sacrificial layer 52 is initially structured. At the same time, at least one further continuous recess may also be structured through fourth sacrificial layer 52, in which a diaphragm clamping 62 of diaphragm 58 mechanically and electrically contacts at least one component 50a formed from second electrode layer 48 and/or a component 50 of capacitor sealing structure 54. Depending on the design, component 50a or component 50 may be part of capacitor sealing structure 54.

Figure 1E:
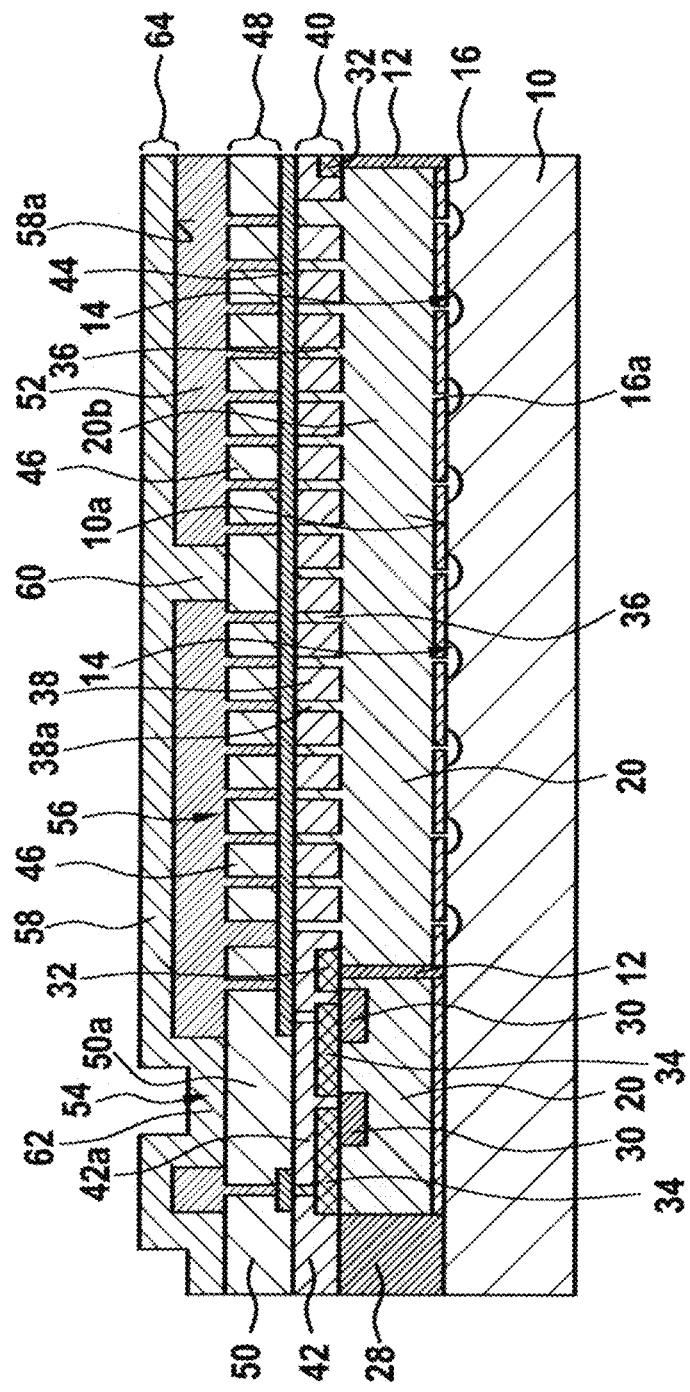

After the structuring of fourth sacrificial layer 52, diaphragm 58 may be formed from a diaphragm layer 64 deposited onto fourth sacrificial layer 52. Diaphragm 58 is formed with a diaphragm thickness oriented perpendicularly to substrate surface 10a in such a way that later exposed diaphragm 58 may bulge. An intermediate product is illustrated in FIG. 1E.

Diaphragm layer 64 is preferably a semiconductor and/or metal layer, for example a polysilicon layer 64. Diaphragm layer 64 may be optionally deposited with an initial thickness oriented perpendicularly to substrate interface 10a, which is larger than a desired target thickness oriented perpendicularly to substrate surface 10a. In this case, diaphragm layer 64 deposited with the initial thickness may be planarized with the aid of a chemical-mechanical polishing step until diaphragm layer 64 has the desired target thickness. In this way, discontinuities, steps or irregular topographies in diaphragm layer 64 may be avoided. The initial thickness of diaphragm layer 64 oriented perpendicularly to substrate surface 10a is preferably greater than or equal to a sum of a layer thickness of fourth sacrificial layer 52 oriented perpendicularly to substrate surface 10a and the target thickness of diaphragm layer 64. Alternatively, a further semiconductor and/or metal layer, for example a polysilicon layer, may be deposited onto fourth sacrificial layer 52 prior to the deposition of diaphragm layer 64. Fourth sacrificial layer 52 may be subsequently exposed again, at least in areas, for example, by carrying out a chemical-mechanical polishing step of the further semiconductor and/or metal layer. A planar surface may also be achieved by the chemical-mechanical polishing step. Discontinuities, steps or topographies on the surface and in subsequently deposited diaphragm layer 64 may be avoided in this way. In this type of processing, diaphragm layer 64 may be applied directly in the desired target thickness, by which additionally arising thickness tolerances due to a chemical-mechanical polishing step of diaphragm layer 64 may be avoided.

FIG. 1F shows an intermediate product after an at least partial removal of sacrificial layers 20, 36, 44 and 52. This is done by etching the at least one material of sacrificial layers 20, 36, 44 and 52 with the aid of an etching medium, which is conducted into later interior volume 56 via at least one etching channel access 66a oriented perpendicularly to substrate surface 10a and/or at least one etching channel 66b oriented in parallel to substrate surface 10a. Etching mask layer 16 is preferably also etched, at least in areas.

If desired, the particular etching medium may be conducted for this purpose directly into later cavity 68 via at least one etching channel 66b running through frame structure 12 and oriented in parallel to substrate surface 10a. Frame structure 12 and/or insulating area 32 may be designed in such a way that they also limit etching channel 66b oriented in parallel to substrate surface 10a, at least in areas. With the aid of the at least one indentation 14 formed in substrate surface 10a, a rapid distribution of the particular etching medium over a wide area may be effectuated, by which the etching process illustrated in FIG. 1F may be accelerated. The etching medium is preferably a gaseous etching medium, for example hydrogen fluoride vapor (HF vapor). If sacrificial layers 20, 36, 44 and 52 and etching mask layer 16 are made from silicon dioxide, they are comparatively quickly etched with the aid of hydrogen fluoride vapor, while the hydrogen fluoride vapor has a negligibly lower etching rate vis-à-vis the silicon-rich silicon nitride of the at least one insulating area 32 and the at least one etch stop layer 34.

With the aid of the at least partial removal of sacrificial layers 20, 36, 44 and 52 and possibly etching mask layer 16, diaphragm 58 is exposed in such a way that its diaphragm inner side 58a limits at least partially exposed interior volume 56. In the case of a pressure difference not equal to zero between a pressure present on a diaphragm outer side 58b of diaphragm 58 facing away from interior volume 56 and a reference pressure present in interior volume 56, diaphragm 58 is bulgeable/bulged, by which the at least one first electrode 46 suspended at diaphragm inner side 58a is adjustable/adjusted. The micromechanical component illustrated in FIG. 1F may thus be advantageously used for pressure measurements.

With the aid of the etching process described here, a cavity 68, which frames frame structure 12, is also created by removing subarea 20b of first sacrificial layer 20 framed by frame structure 12 and possibly etching mask layer 16. As is apparent in FIG. 1F, in the manufacturing method described here, the at least one first counter-electrode 38 is fastened directly or indirectly to frame structure 12 in such a way that the at least one first counter-electrode 38 at least partially spans cavity 68 in such a way that at least one gas is transferable between cavity 68 and interior volume 56 via the at least one opening 38a formed at and/or in the at least one first counter-electrode 38. Outgassing substances, for example, hydrogen, nitrogen, oxygen (e.g., outgassed from tetraethyl orthosilicate (TEOS)), dopants and thus forming carbon-containing gases, such as, in particular, methane or ethane, may thus be distributed out of interior volume 56, via the at least one opening 38a, formed at and/or in the at least one first counter-electrode 38, into cavity 68 and thus into a larger volume. A "volume enlargement" of a volume available for distributing the at least one gas is thus achieved with the aid of the at least one opening 38a formed at and/or in the at least one first counter-electrode 38 and cavity 68. Due to the "volume enlargement," an equal quantity of outgassing/diffusing substances results in a smaller change in the reference pressure in interior volume 56 and cavity 68. Outgassing/diffusion effects in/within interior volume 56, which occur, in particular, at higher temperatures, therefore have hardly any influence or a significantly lesser influence, on the precision/long-term stability of the pressure measurements carried out with the aid of bulgeable diaphragm 58. It is further possible to achieve an additional "volume enlargement" via the number, shape and depth of indentations 14 introduced into a substrate surface 10a of substrate 10.

In conventional pressure sensors, outgassing/diffusion effects frequently result in an increase of the (reference) pressure in a cavity of the particular pressure sensor spanned by a diaphragm, and thus in a change in the sensor characteristic or in a drift of sensor signals of the particular pressure sensor. In contrast, in the micromechanical component manufactured with the aid of the manufacturing method described here, a weakening of the impacts of output effects is achieved by the "volume enlargement." Accordingly, the outgassing substances result in an impairment, or only in a significantly lower impairment, of a sensor function or the sensor characteristic and/or in a significantly lower impairment of the stability/long-term stability of a sensor signal during a carrying out of pressure measurements with the aid of bulgeable diaphragm 58.

Figure 2A:
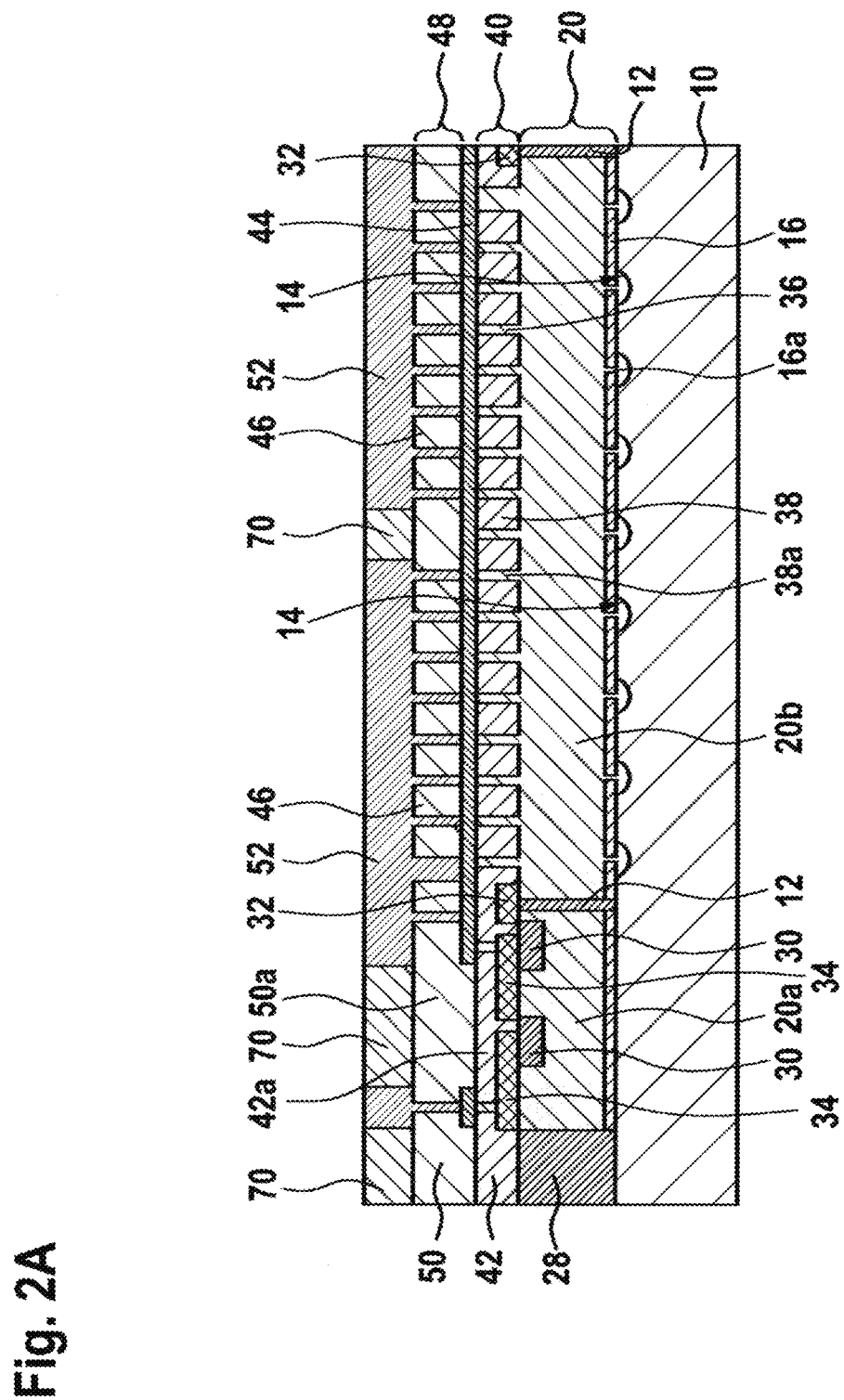
FIGS. 2A and 2B show schematic cross sections of intermediate products for explaining a second specific example embodiment of the manufacturing method for a micromechanical component for a sensor device, in accordance with the present invention.
Figure 2B:
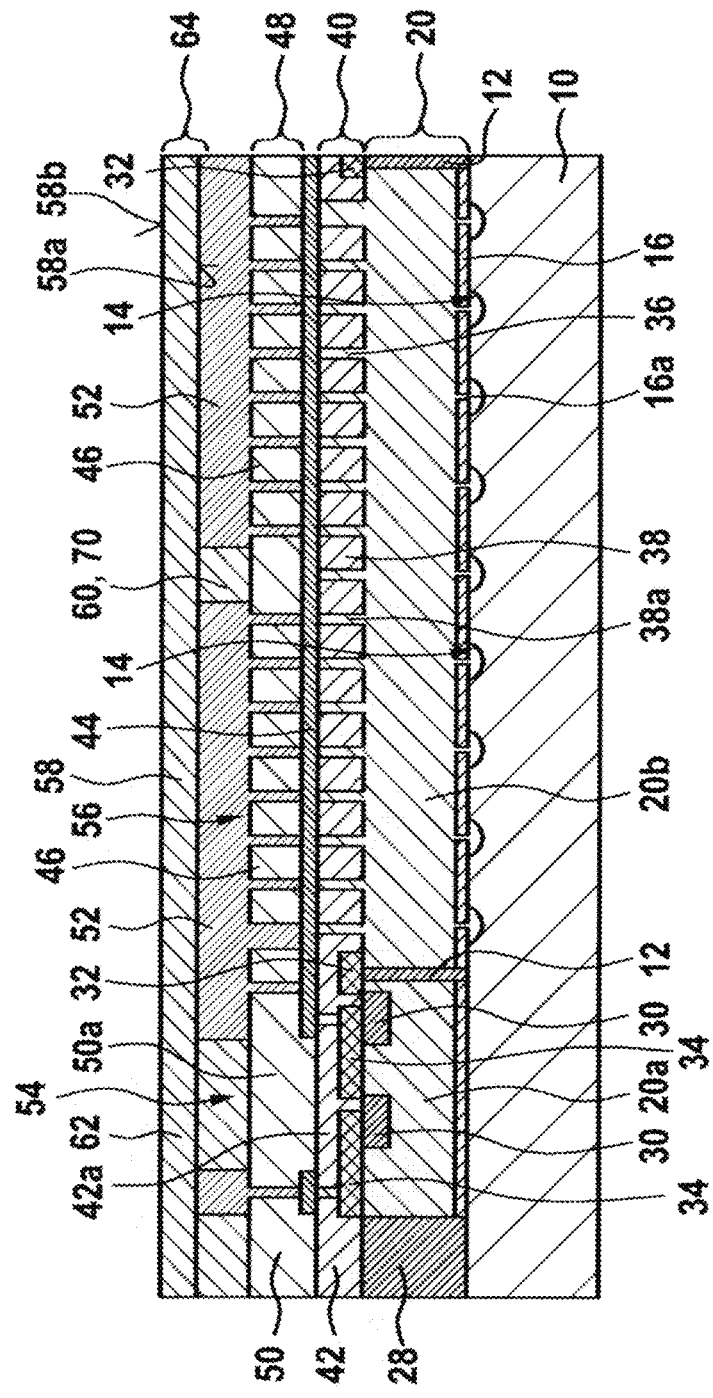

FIGS. 2A and 2B show schematic cross sections of intermediate products for explaining a second specific embodiment of the manufacturing method for a micromechanical component for a sensor device.

As is illustrated in FIG. 2A, after the structuring of fourth sacrificial layer 52 and prior to the deposition of diaphragm layer 64, the at least one continuous structuring/recess through fourth sacrificial layer 52 and/or the at least one indentation optionally introduced on the upper side of fourth sacrificial layer 52 may be completely filled by depositing an at least identical material 70 to that of later diaphragm layer 64. A chemical-mechanical polishing step may subsequently be further carried out, with the aid of which the at least one identical material 70 is removed from the surface, at least in areas, in such a way that fourth sacrificial layer 52 is exposed again, at least in areas, and a planar surface is generated, before diaphragm layer 64 is deposited on fourth sacrificial layer 52 (cf. FIG. 2B). Discontinuities, steps or irregular topographies in later diaphragm layer 64 may be avoided with the aid of the method steps described here.

With regard to further method steps of the manufacturing method described here and their advantages, reference is hereby made to the preceding specific embodiment in FIGS. 1A through 1F.

Figure 3A:
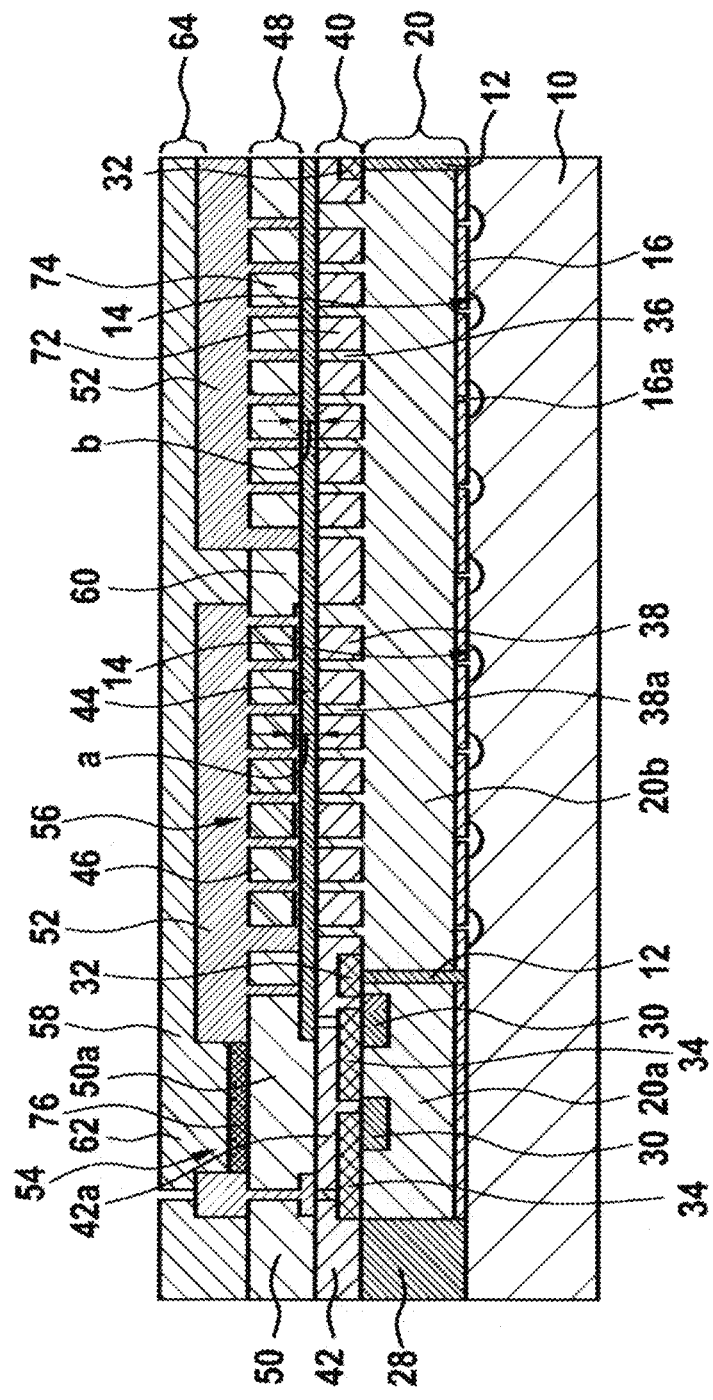
FIGS. 3A through 3C show schematic cross sections of intermediate products for explaining a third specific example embodiment of the manufacturing method for a micromechanical component for a sensor device, in accordance with the present invention.
Figure 3B:
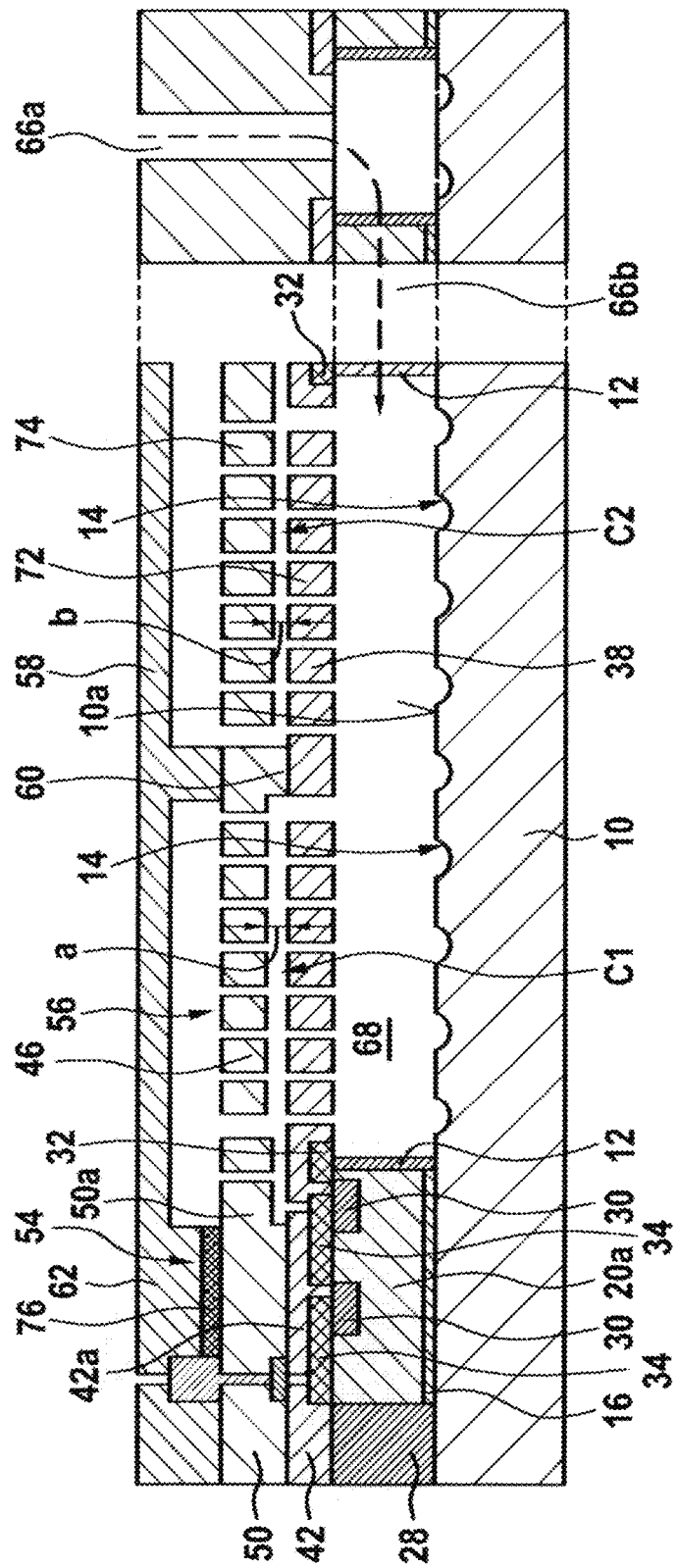
Figure 3C:
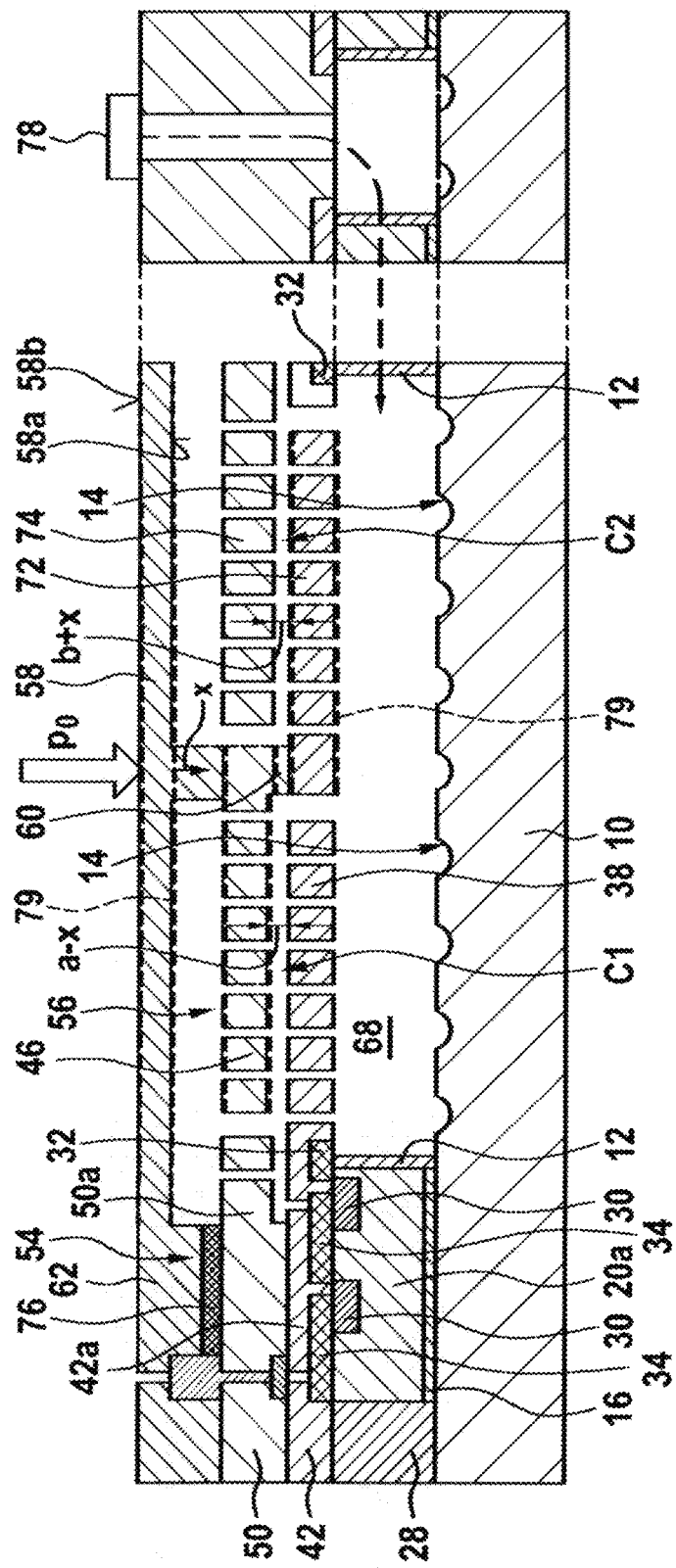

FIGS. 3A through 3C show schematic representations of intermediate products for explaining a third specific embodiment of the manufacturing method for a micromechanical component for a sensor device.

In the manufacturing method described here, the later micromechanical component is additionally formed including at least one second electrode 72 present in interior volume 56 and at least one second counter-electrode 74 present in interior volume 56. The at least one second electrode 72 is suspended at diaphragm inner side 58a of diaphragm 58 via the at least one suspension structure 60 in such a way that the at least one second electrode 72, like the at least one first electrode 46, is adjustable/adjusted with the aid of a bulging of diaphragm 58. The at least one second counter-electrode 74 is situated on a side of the at least one second electrode 72 facing away from substrate 10 in such a way that a site, location and/or position of the at least one second counter-electrode 74 is not impaired by a bulging of diaphragm 58 with respect to the at least one second electrode 72.

As is apparent in FIG. 3A, the at least one first counter-electrode 38 and the at least one second electrode 72 are formed from first electrode layer 40.

The at least one first electrode 46 and the at least one second counter-electrode 74 are formed from second electrode layer 48. In addition, diaphragm 58 is electrically insulated from components 38, 42a, 46, 50, 50a and 74 formed from first electrode layer 40 and second electrode layer 48, at least in areas, with the aid of at least one diaphragm insulating area 76 made from the at least one and/or at least one further electrically insulating material.

With the aid of electrode layer 40, electrode layer 48 and contact hole structures in insulating area 34 and diaphragm insulating area 76, separate/separated electrical contacting structures may furthermore be manufactured, which permit an electrical contacting of diaphragm layer 64 and diaphragm 58 via at least one printed conductor 30. The at least one electrically insulating material of the at least one diaphragm insulating area 76 preferably has an electrical conductivity in each case of less than or equal to $10^{-8}$ S·cm$^{-1}$ or a specific resistance of greater than or equal to $10^8$ Ω·cm. It is also advantageous if the at least one electrically insulating material of the at least one diaphragm insulating area 76 has an etching rate with respect to an etching medium used later on, which is lower at least by a factor of 2 than the etching rate of the particular etching medium for the at least one material of first sacrificial layer 20. The at least one electrically insulating material of the at least one diaphragm insulating area 76 may be, for example, silicon-rich silicon nitride. In the example described here, the at least one diaphragm insulating area 76 is deposited on second electrode layer 48.

Prior to the at least partial removal of sacrificial layers 20, 36, 44 and 52, a first initial distance a between the at least one first counter-electrode 38 and the at least one first electrode 46 is preferably greater than a second initial distance b between the at least one second electrode 72 and the at least one second counter-electrode 74. The reasons for a corresponding selection of initial distances a and b are discussed below.

FIG. 3B shows an intermediate product after the at least partial removal of sacrificial layers 20, 36, 44 and 52. It is apparent that the micromechanical component includes a differential capacitor structure arrangement including two plane-parallel plate capacitor structures C1 and C2, the at least one first counter-electrode 38 and the at least one first electrode 46 implementing first plate capacitor structure C1, and the at least one second electrode 72 and the at least one second counter-electrode 74 implementing second plate capacitor structure C2. In the case of an inward bulging of diaphragm 58 into interior volume 56, the capacitance of first plate capacitor structure C1 increases, while the capacitance of second plate capacitor structure C2 decreases. If capacitor structures C1 and C2 are interconnected with a half-bridge in a Wheatstone bridge arrangement, a significantly more sensitive pressure measurement is obtained, due to the difference formation.

In the case of a closure of the at least one etching channel access 66a with the aid of at least one seal 78, as illustrated in FIG. 3C, the reference pressure, generally an underpressure, is enclosed in interior volume 56. This results in that diaphragm 58 is already deflected by a surrounding initial pressure $p_c$), for example the atmospheric pressure. As illustrated with the aid of dashed lines 79, in first plate capacitor structure C1, a distance between the at least one first counter-electrode 38 and the at least one first electrode 46 is therefore reduced by a difference x, starting from first initial distance a, and in second plate capacitor structure C2, a distance between the at least one second electrode 72 and the at least one second counter-electrode 74 is increased by difference x, starting from second initial distance b. By a suitable selection of initial distances a and b, it may thus be ensured that the capacitances of plate capacitor structures C1 and C2 are the same at particular output pressure $p_0$.

With regard to further method steps of the manufacturing method described here and their advantages, reference is made to the specific embodiments in FIGS. 1 and 2 described above.

Figure 4:
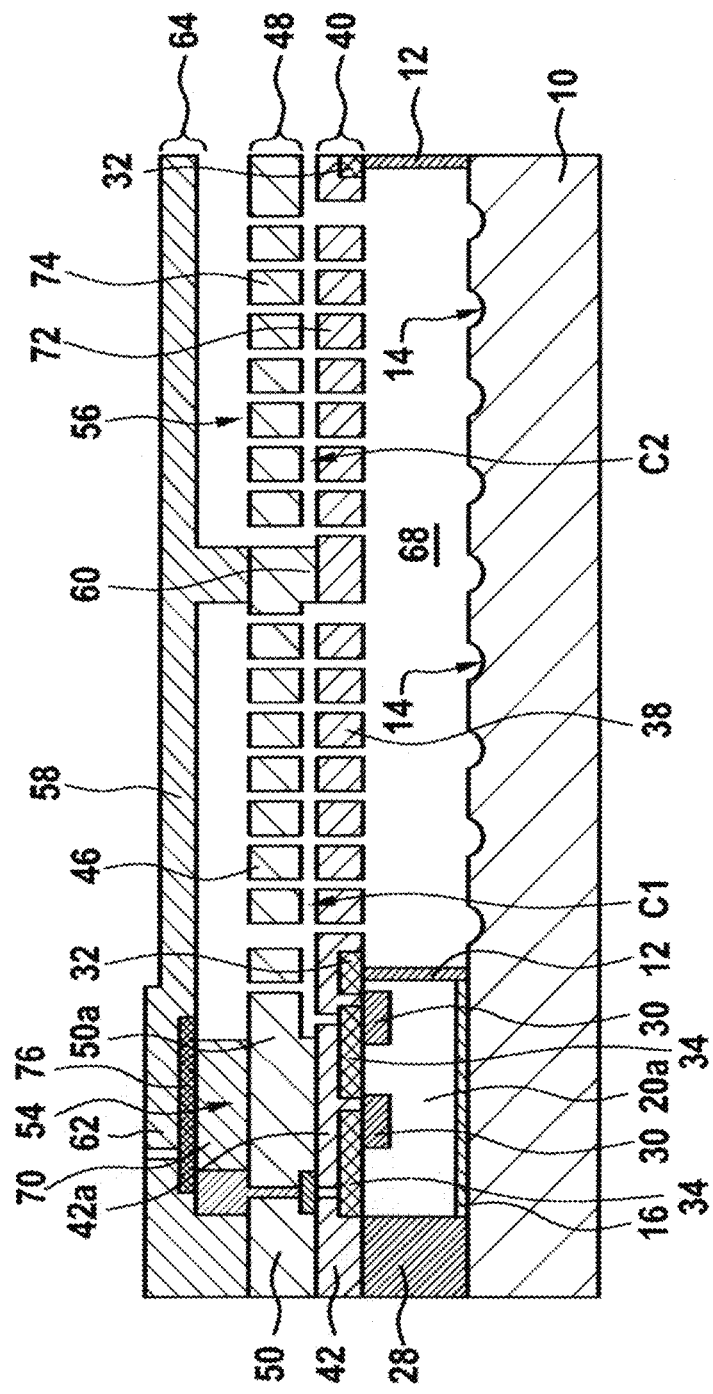
FIG. 4 shows a schematic representation of a first specific example embodiment of the micromechanical component, in accordance with the present invention.

FIG. 4 shows a schematic representation of a first specific embodiment of the micromechanical component.

The micromechanical component for a sensor device schematically illustrated in FIG. 4 includes a substrate 10, at least one first counter-electrode 38, at least one first electrode 46 adjustably situated on a side of the at least one counter-electrode 38 facing away from substrate 10, and a capacitor sealing structure 54, which is directly or indirectly fastened to substrate 10 and which seals gas-tight an interior volume 56, including the at least one first counter-electrode 38 present therein and the at least one first electrode 46 present therein.

In addition, the at least one first counter-electrode 38 is fastened directly or indirectly to a frame structure 12, which is fastened directly or indirectly to substrate 10, frame structure 12 framing a cavity 68, and the at least one first counter-electrode 38 at least partially spanning cavity 68 in such a way that at least one gas is transferable between cavity 68 and interior volume 56 via at least one opening 38a formed at and/or in the at least one first counter-electrode 38. The micromechanical component thus also has the advantages described above.

As an advantageous refinement, the micromechanical component may also include the at least one second electrode 72, the at least one second counter-electrode 74 and the at least one diaphragm insulating area 76. For example, the at least one diaphragm insulating area 76 may be deposited after the deposition of material 70 and the optional chemical-mechanical polishing step for exposing fourth sacrificial layer 52, at least in areas, so that the at least one diaphragm insulating area 76 is situated between at least one subarea 50 and 50a and diaphragm layer 64, at least in areas.

With regard to further features of the micromechanical component in FIG. 4 and their advantages, reference is made to the above-described specific embodiments of the manufacturing method in FIGS. 1 through 3.

Figure 5:
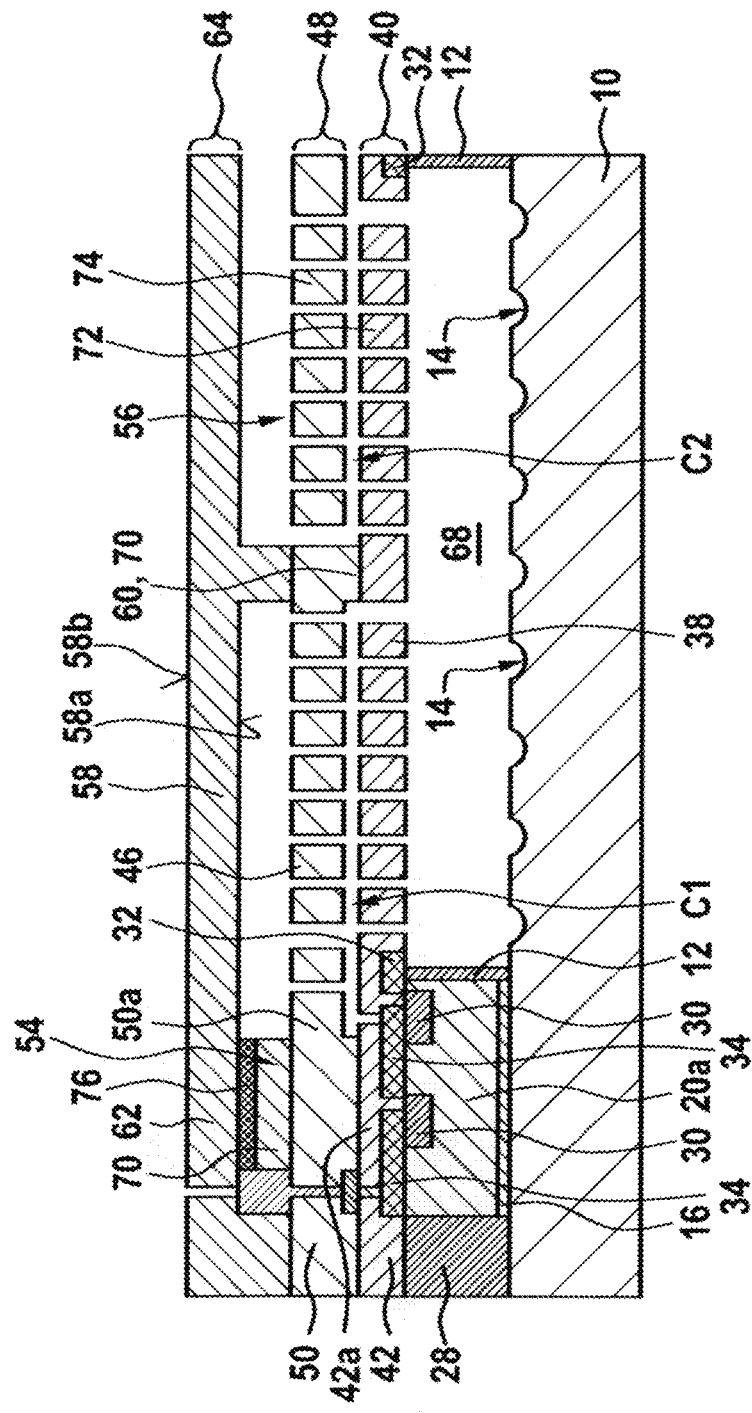
FIG. 5 shows a schematic representation of a second specific example embodiment of the micromechanical component, in accordance with the present invention.

FIG. 5 shows a schematic representation of a second specific embodiment of the micromechanical component.

As is apparent in FIG. 5, the at least one diaphragm insulating area 76 may be also formed in each case in a structuring, which passes through fourth sacrificial layer 52 and is not completely filled with material 70.

With regard to further features of the micromechanical component in FIG. 5 and their advantages, reference is made to the above-described specific embodiments in FIG. 4 and the manufacturing methods in FIGS. 1 through 3.

Figure 6:
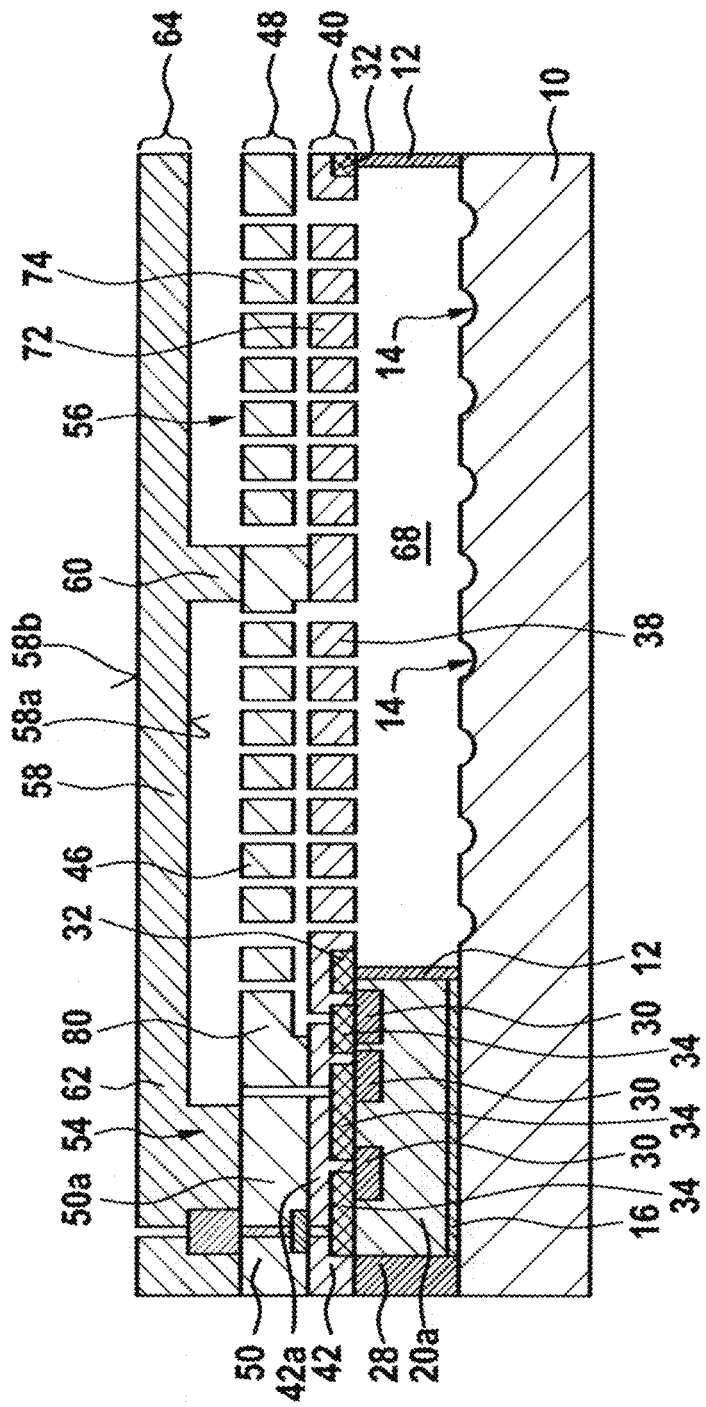
FIG. 6 shows a schematic representation of a third specific example embodiment of the micromechanical component, in accordance with the present invention.

FIG. 6 shows a schematic representation of a third specific embodiment of the micromechanical component.

The micromechanical component in FIG. 6 is formed with an anchoring area 80 of the at least one second counter-electrode 74, which is formed separately from capacitor sealing structure 54. (The at least one first electrode 46 is not mechanically and/or electrically connected to separate anchoring area 80.) In this way, it is not necessary to form the at least one diaphragm insulating area 76. In the specific embodiment in FIG. 6, all anchoring areas of electrode layers 40 and 48 and those of diaphragm layer 64 are thus provided on etch stop layer 34, at least in areas, and are formed laterally insulated from each other by etch stop layer 34. An electrical contacting of the individual anchoring areas may take place via printed conductors 30 and corresponding contact hole structures in etch stop layer 34.

With regard to further features of the micromechanical component in FIG. 6 and their advantages, reference is made to the above-described specific embodiments in FIGS. 4 and 5 and the manufacturing methods in FIGS. 1 through 3.

Figure 7:
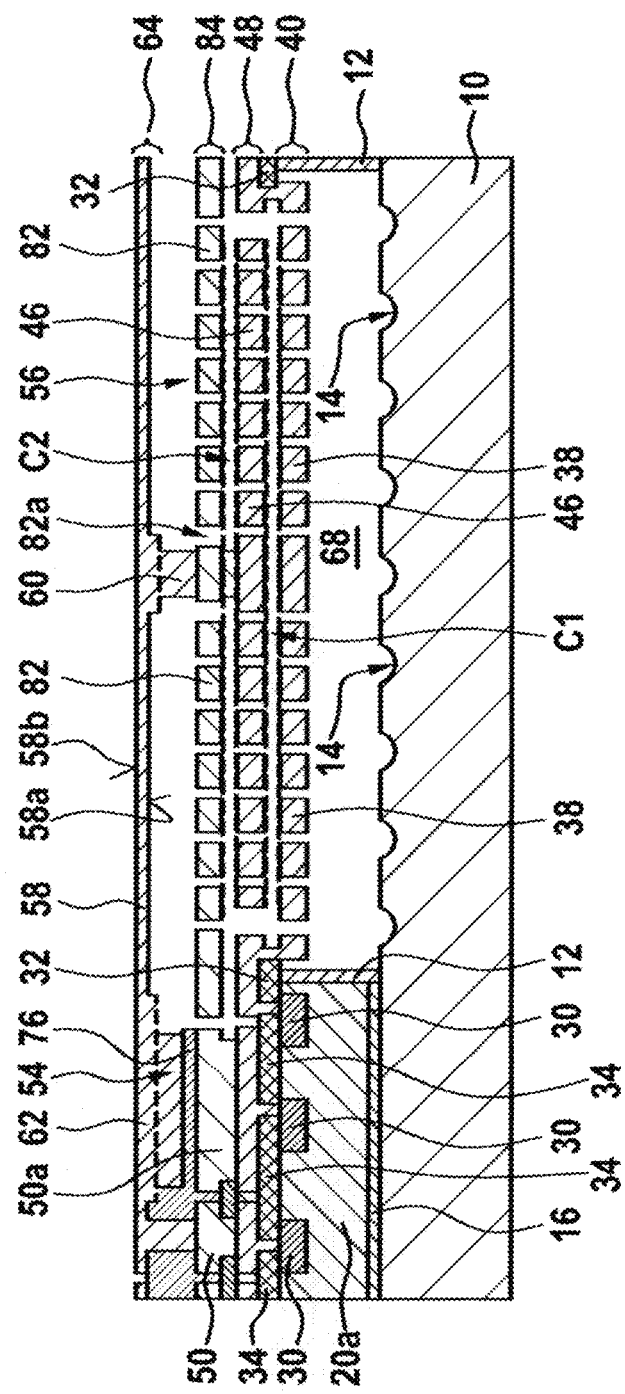
FIG. 7 shows a schematic representation of a fourth specific embodiment of the micromechanical component, in accordance with the present invention.

FIG. 7 shows a schematic representation of a fourth specific embodiment of the micromechanical component.

As an optional refinement, the micromechanical component in FIG. 7 also includes at least one second counter-electrode 82 present in the interior volume 56, which is fastened directly or indirectly to capacitor sealing structure 54 and/or substrate 10 on the side of the at least one first electrode 46 facing away from substrate 10. The at least one second counter-electrode 82 is preferably designed including at least one recess 82a penetrating/passing through counter-electrode 82, through which the at least one suspension structure 60 of first electrode 46 is guided, which is mechanically and electrically conductively fastened to diaphragm 58. The micromechanical component in FIG. 7 thus also includes a differential capacitor structure arrangement including two parallel plate capacitor structures C1 and C2, the at least one first counter-electrode 38 and the at least one first electrode 46 implementing first plate capacitor structure C1, and the at least one first electrode 46 and the at least one second counter-electrode 82 implementing second plate capacitor structure C2. In the case of an inward bulging of diaphragm 58, the capacitance of first plate capacitor structure C1 increases, while the capacitance of second plate capacitor structure C2 decreases. With the aid of an interconnection of capacitor structures C1 and C2 to a half-bridge in a Wheatstone bridge arrangement, a significantly more sensitive pressure measurement may be obtained, due to the difference formation. The sensitivity of the pressure measurement may be further increased if two such pressure sensors of an identical design are interconnected to a full Wheatstone bridge. To improve the measuring accuracy, particular interior volumes 56 may be optionally connected to each other in such a way that a pressure compensation between the interior volumes may take place.

The at least one second counter-electrode 82 is formed from a third electrode layer 84. Third electrode layer 84 is understood to be a semiconductor and/or metal layer. Third electrode layer 84 may be, for example, a polysilicon layer 84. In addition, diaphragm 58 is electrically insulated from the at least one component 82 formed from third electrode layer 84 with the aid of the at least one diaphragm insulating area 76.

Indentations, which are filled with an additional material, may be used to locally reduce the introduction of a mechanical stress into diaphragm 58 upon an application of force onto diaphragm 58, and which may contribute to increasing the diaphragm stability, may furthermore be situated in fourth sacrificial layer 52, at least in the area of diaphragm clamping 62 and/or at least in the area of the contact point between suspension structure 60 and diaphragm 58. The additional material may be, for example, a semiconductor and/or metal layer.

With regard to further features of the micromechanical component in FIG. 7 and their advantages, reference is made to the above-described specific embodiments in FIGS. 4 through 6 and the manufacturing methods in FIGS. 1 through 3.

All specific embodiments explained above may each include at least one polysilicon layer as their at least one silicon layer. In particular, the at least one silicon layer/polysilicon layer may be doped to increase its electrical conductivity. Since the doping of the at least one silicon layer/polysilicon layer may be carried out by standard methods, it will not be discussed in greater detail here.

What is claimed is:

1. A micromechanical component for a sensor device, comprising:
    a substrate;
    at least one first counter-electrode, which is fastened directly or indirectly to the substrate;
    at least one first electrode, which is adjustably situated on a side of the at least one first counter-electrode facing away from the substrate;
    a capacitor sealing structure, which is fastened directly or indirectly to the substrate and which seals an interior volume gas-tight, including the at least one first counter-electrode present in the interior volume and the at least one first electrode present in the interior volume; and
    a frame structure fastened directly or indirectly to substrate, the at least one first counter-electrode being fastened directly or indirectly to the frame structure, the frame structure framing a cavity, and the at least one first counter-electrode at least partially spanning the cavity so that at least one gas is transferable between the cavity and the interior volume via at least one opening formed at and/or in the at least one first counter-electrode;
    wherein the capacitor sealing structure includes a stretched diaphragm on a side of the at least one first electrode facing away from the substrate, a diaphragm inner side of the diaphragm limits the interior volume, and the diaphragm is bulgeable at a pressure difference.

2. The micromechanical component as recited in claim 1, wherein at least one indentation is structured in a substrate surface of the substrate abutting the cavity within the frame structure.

3. The micromechanical component as recited in claim 1, wherein the at least one first counter-electrode fastened directly or indirectly at least to the frame structure is electrically insulated from the frame structure and/or the substrate using at least one insulating area formed from at least one electrically insulating material, which is situated or formed within the frame structure and/or between the frame structure and the at least one first counter-electrode.

4. The micromechanical component as recited in claim 3, wherein the at least one electrically insulating material of the at least one insulating area has an electrical conductivity in each case of less than or equal to $10^{-8}$ S·cm$^{-1}$ and/or a specific resistance of greater than or equal to $10^8$ Ω·cm.

5. The micromechanical component as recited in claim 1, wherein the diaphragm is bulgeable at a pressure difference not equal to zero between a pressure present on a diaphragm outer side of the diaphragm facing away from the interior volume and a reference pressure present in the interior volume, by which the at least one first electrode is adjustable, which is suspended at the diaphragm inner side of the diaphragm and is electrically connected to the diaphragm.

6. The micromechanical component as recited in claim 5, wherein the at least one first electrode is suspended at the diaphragm inner side via at least one suspension structure fastened to the diaphragm inner side and is electrically connected to the diaphragm, and the micromechanical component additionally includes at least one second electrode present in the interior volume, which is also suspended at the diaphragm inner side via the at least one suspension structure and is electrically connected to the diaphragm so that the at least one second electrode, like the at least one first electrode, is adjustable with the aid of a bulging of the diaphragm, and the micromechanical component additionally includes at least one second counter-electrode present in the interior volume, which is situated on a side of the at least one second electrode facing away from the substrate.

7. The micromechanical component as recited in claim 6, wherein the at least one first counter-electrode and the at least one second electrode are formed from a first electrode layer, and the at least one first electrode and the at least one second counter-electrode are formed from a second electrode layer, the diaphragm is electrically insulated from components formed from the second electrode layer with the aid of at least one diaphragm insulating area made from the at least one and/or at least one further electrically insulating material.

8. The micromechanical component as recited in claim 7, wherein the at least one diaphragm insulating area has an electrical conductivity in each case of less than or equal to $10^{-8}$ S·cm$^{-1}$ and/or a specific resistance of greater than or equal to $10^8$ Ω·cm.

9. The micromechanical component as recited in claim 5, wherein the at least one first electrode is suspended at the diaphragm inner side via at least one suspension structure fastened to the diaphragm inner side and is electrically connected to the diaphragm, and the micromechanical component additionally includes at least one second counter-electrode present in the interior volume, which is fastened directly or indirectly to the capacitor sealing structure and/or the substrate on the side of the least one first electrode facing away from the substrate, and which includes at least one continuous recess, through which the at least one suspension structure of the first electrode is guided.

10. The micromechanical component as recited in claim 9, wherein the at least one first counter-electrode is formed from a first electrode layer, the at least one first electrode is formed from a second electrode layer, and the at least one second counter-electrode is formed from a third electrode layer, and the diaphragm is electrically insulated from the at least one counter-electrode formed from the third electrode layer using at least one diaphragm insulating area made from the at least one and/or at least one further electrically insulating material.

11. A manufacturing method for a micromechanical component for a sensor device, the method comprising:
fastening at least one first counter-electrode directly or indirectly to a substrate;
situating at least one adjustable first electrode on a side of the at least one first counter-electrode facing away from the substrate;
forming a capacitor sealing structure, which is fastened directly or indirectly to the substrate and which seals gas-tight an interior volume, including the at least one first counter-electrode present in the interior volume and the at least one first electrode present in the interior volume;
fasting a frame structure, which frames a cavity, directly or indirectly to the substrate; and
fastening the at least one first counter-electrode directly or indirectly at least to the frame structure so that the at least one first counter-electrode at least partially spans the cavity so that at least one gas is transferable between the cavity and the interior volume via at least one opening formed at and/or in the at least one first counter-electrode;
wherein the capacitor sealing structure includes a stretched diaphragm on a side of the at least one first electrode facing away from the substrate, a diaphragm inner side of the diaphragm limits the interior volume, and the diaphragm is bulgeable at a pressure difference.

12. The method as recited in claim 11, wherein the diaphragm is bulgeable at a pressure difference not equal to zero between a pressure present on a diaphragm outer side of the diaphragm facing away from the interior volume and a reference pressure present in the interior volume, by which the at least one first electrode is adjustable, which is suspended at the diaphragm inner side of the diaphragm and is electrically connected to the diaphragm.

13. The method as recited in claim 12, wherein the at least one first electrode is suspended at the diaphragm inner side via at least one suspension structure fastened to the diaphragm inner side and is electrically connected to the diaphragm, and the micromechanical component additionally includes at least one second electrode present in the interior volume, which is also suspended at the diaphragm inner side via the at least one suspension structure and is electrically connected to the diaphragm so that the at least one second electrode, like the at least one first electrode, is adjustable with the aid of a bulging of the diaphragm, and the micromechanical component additionally includes at least one second counter-electrode present in the interior volume, which is situated on a side of the at least one second electrode facing away from the substrate.

14. The method as recited in claim 13, wherein the at least one first counter-electrode and the at least one second electrode are formed from a first electrode layer, and the at least one first electrode and the at least one second counter-electrode are formed from a second electrode layer, the diaphragm is electrically insulated from components formed from the second electrode layer with the aid of at least one diaphragm insulating area made from the at least one and/or at least one further electrically insulating material.

15. The method as recited in claim 14, wherein the at least one diaphragm insulating area has an electrical conductivity in each case of less than or equal to $10^{-8}$ S·cm$^{-1}$ and/or a specific resistance of greater than or equal to $10^8$ Ω·cm.

16. The method as recited in claim 12, wherein the at least one first electrode is suspended at the diaphragm inner side via at least one suspension structure fastened to the diaphragm inner side and is electrically connected to the diaphragm, and the micromechanical component additionally includes at least one second counter-electrode present in the interior volume, which is fastened directly or indirectly to the capacitor sealing structure and/or the substrate on the side of the least one first electrode facing away from the substrate, and which includes at least one continuous recess, through which the at least one suspension structure of the first electrode is guided.

17. The method as recited in claim 16, wherein the at least one first counter-electrode is formed from a first electrode layer, the at least one first electrode is formed from a second electrode layer, and the at least one second counter-electrode is formed from a third electrode layer, and the diaphragm is electrically insulated from the at least one counter-electrode formed from the third electrode layer using at least one diaphragm insulating area made from the at least one and/or at least one further electrically insulating material.

18. The method as recited in claim 11, wherein at least one indentation is structured in a substrate surface of the substrate abutting the cavity within the frame structure.

19. The method as recited in claim 11, wherein the at least one first counter-electrode fastened directly or indirectly at least to the frame structure is electrically insulated from the frame structure and/or the substrate using at least one insulating area formed from at least one electrically insulating material, which is situated or formed within the frame structure and/or between the frame structure and the at least one first counter-electrode.

20. The method as recited in claim 19, wherein the at least one electrically insulating material of the at least one insulating area has an electrical conductivity in each case of less than or equal to $10^{-8}$ S·cm$^{-1}$ and/or a specific resistance of greater than or equal to $10^8$ Ω·cm.

* * * * *